United States Patent
Barber et al.

(10) Patent No.: US 8,035,277 B2
(45) Date of Patent: Oct. 11, 2011

(54) METHOD FOR FORMING A MULTI-LAYER ELECTRODE UNDERLYING A PIEZOELECTRIC LAYER AND RELATED STRUCTURE

(75) Inventors: Bradley P. Barber, Acton, MA (US); Craig E. Carpenter, Shirley, MA (US); Paul P. Gehlert, Sterling, MA (US); Christopher F. Shepard, Nashua, NH (US)

(73) Assignee: Avago Technologies Wireless IP (Singapore) Pte.Ltd., Singapore (SG)

( * ) Notice: Subject to any disclaimer, the term of this patent is extended or adjusted under 35 U.S.C. 154(b) by 135 days.

(21) Appl. No.: 12/221,276

(22) Filed: Aug. 1, 2008

(65) Prior Publication Data
US 2009/0045704 A1 Feb. 19, 2009

Related U.S. Application Data

(60) Provisional application No. 60/964,644, filed on Aug. 14, 2007.

(51) Int. Cl.
*H01L 41/08* (2006.01)

(52) U.S. Cl. .......... 310/334; 310/320; 310/364

(58) Field of Classification Search .......... 310/320, 310/324, 364
See application file for complete search history.

(56) References Cited

U.S. PATENT DOCUMENTS

| | | | |
|---|---|---|---|
| 3,363,119 A | 1/1968 | Koneval et al. | |
| 3,365,591 A | 1/1968 | Curran et al. | |
| 3,401,276 A | 9/1968 | Curran et al. | |
| 5,325,012 A * | 6/1994 | Sato et al. | 310/364 |
| 6,420,202 B1 | 7/2002 | Barber et al. | |
| 6,812,619 B1 | 11/2004 | Kaitila et al. | |
| 6,933,809 B2 | 8/2005 | Kyoung et al. | |
| 6,984,918 B1 | 1/2006 | Hachigo et al. | |
| 7,170,215 B2 * | 1/2007 | Namba et al. | 310/324 |
| 7,276,836 B2 | 10/2007 | Umeda et al. | |
| 7,323,805 B2 | 1/2008 | Sano et al. | |
| 7,323,953 B2 | 1/2008 | Yokoyama et al. | |
| 7,345,410 B2 | 3/2008 | Grannen et al. | |
| 7,358,831 B2 | 4/2008 | Larson et al. | |
| 7,482,737 B2 | 1/2009 | Yamada et al. | |
| 7,489,067 B2 | 2/2009 | Metzger et al. | |
| 7,597,757 B2 | 10/2009 | Conley et al. | |
| 2002/0121840 A1 | 9/2002 | Larson et al. | |
| 2005/0140247 A1 | 6/2005 | Lee | |
| 2006/0103492 A1 | 5/2006 | Feng et al. | |
| 2008/0157629 A1 | 7/2008 | Noguchi et al. | |
| 2009/0045703 A1 | 2/2009 | Barber et al. | |
| 2009/0045704 A1 | 2/2009 | Barber et al. | |

FOREIGN PATENT DOCUMENTS

| | | |
|---|---|---|
| JP | 2005-210004 A | 8/2005 |
| KR | 10-2004-0087676 A | 10/2004 |
| WO | 2005008889 | 1/2005 |

* cited by examiner

*Primary Examiner* — Mark Budd

(57) ABSTRACT

According to an exemplary embodiment, a method of forming a multi-layer electrode for growing a piezoelectric layer thereon includes a step of forming a high conductivity metal layer over a substrate. The method further includes a step of forming a seed layer over the high conductivity metal layer. The method further includes a step of forming a high density metal layer over the seed layer. The method further includes a step of forming a piezoelectric layer over the high density metal layer. The high conductivity metal layer, the seed layer, and the high density metal layer form the multi-layer electrode on which the piezoelectric layer is grown.

16 Claims, 6 Drawing Sheets

METHOD FOR FORMING A MULTI-LAYER ELECTRODE UNDERLYING A PIEZOELECTRIC LAYER AND RELATED STRUCTURE

The present application claims the benefit of and priority to a pending provisional patent application entitled "Improved Counter Electrodes for Thin Film Acoustic Wave Devices," Ser. No. 60/964,644 filed on Aug. 14, 2007. The disclosure in that pending provisional application is hereby incorporated fully by reference into the present application.

BACKGROUND OF THE INVENTION

1. Field of the Invention

The present invention generally relates to the field of semiconductor fabrication. More particularly, the invention relates to the fabrication of acoustic wave structures in semiconductor dies.

2. Background Art

Bulk acoustic wave (BAW) resonators, which can be used in frequency control or filtering applications, can include a piezoelectric layer sandwiched between upper and lower electrodes and an underlying acoustic mirror. When an electric field is applied across the piezoelectric layer via the upper and lower electrodes, electrical energy is converted into acoustic energy in the piezoelectric layer through electromechanical coupling, thereby causing the piezoelectric layer to vibrate and generate acoustic waves. However, for a BAW resonator to operate effectively, the piezoelectric layer must be highly textured, i.e., it must have an oriented grain structure. To grow a highly textured piezoelectric layer, however, the grain structure of the underlying lower electrode on which the piezoelectric layer is grown must be properly oriented.

Conventional approaches for growing a highly textured piezoelectric layer typical include extensive underlying layer surface treatment, which can include chemical mechanical polishing (CMP) and/or reactive etch treatment, and a carefully chosen seed layer prior to lower electrode deposition to achieve a lower electrode on which the highly textured piezoelectric layer can be grown. However, the extensive underlying layer surface treatment typically required to achieve a highly textured piezoelectric layer in the conventional BAW resonator can undesirably increase process complexity and manufacturing cost.

Also, for increasing electromechanical coupling, which is important for BAW resonator performance, it is highly desirable to place a high density metal adjacent to the top and bottom surfaces of the piezoelectric layer. Thus, a high density metal, such as molybdenum or tungsten, is typically utilized to form the lower and the upper electrode of the conventional BAW resonator. However, although effective for increasing electromechanical coupling, a high density metal has a relatively high resistance, which can increase electrical loss in the BAW resonator and, thereby, undesirably reduce resonator performance.

SUMMARY OF THE INVENTION

A method for forming a multi-layer electrode underlying a piezoelectric layer and related structure, substantially as shown in and/or described in connection with at least one of the figures, as set forth more completely in the claims.

DETAILED DESCRIPTION OF THE INVENTION

The present invention is directed to a method for forming a multi-layer electrode underlying a piezoelectric layer and related structure. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the invention which use the principles of the present invention are not specifically described in the present application and are not specifically illustrated by the present drawings.

As will be discussed in detail below, the present invention provides an innovative method for forming a multi-layer lower electrode in a BAW (bulk acoustic wave) resonator, where the multi-layer lower electrode enables a highly textured, i.e. an oriented grain structure, piezoelectric layer to be grown thereon and includes a high conductivity metal layer to provide reduced electrical loss in the BAW resonator. Moreover, the invention provides a multi-layer electrode that can be generally utilized to grow a highly textured piezoelectric layer when a highly textured piezoelectric layer is required.

Figure 1:
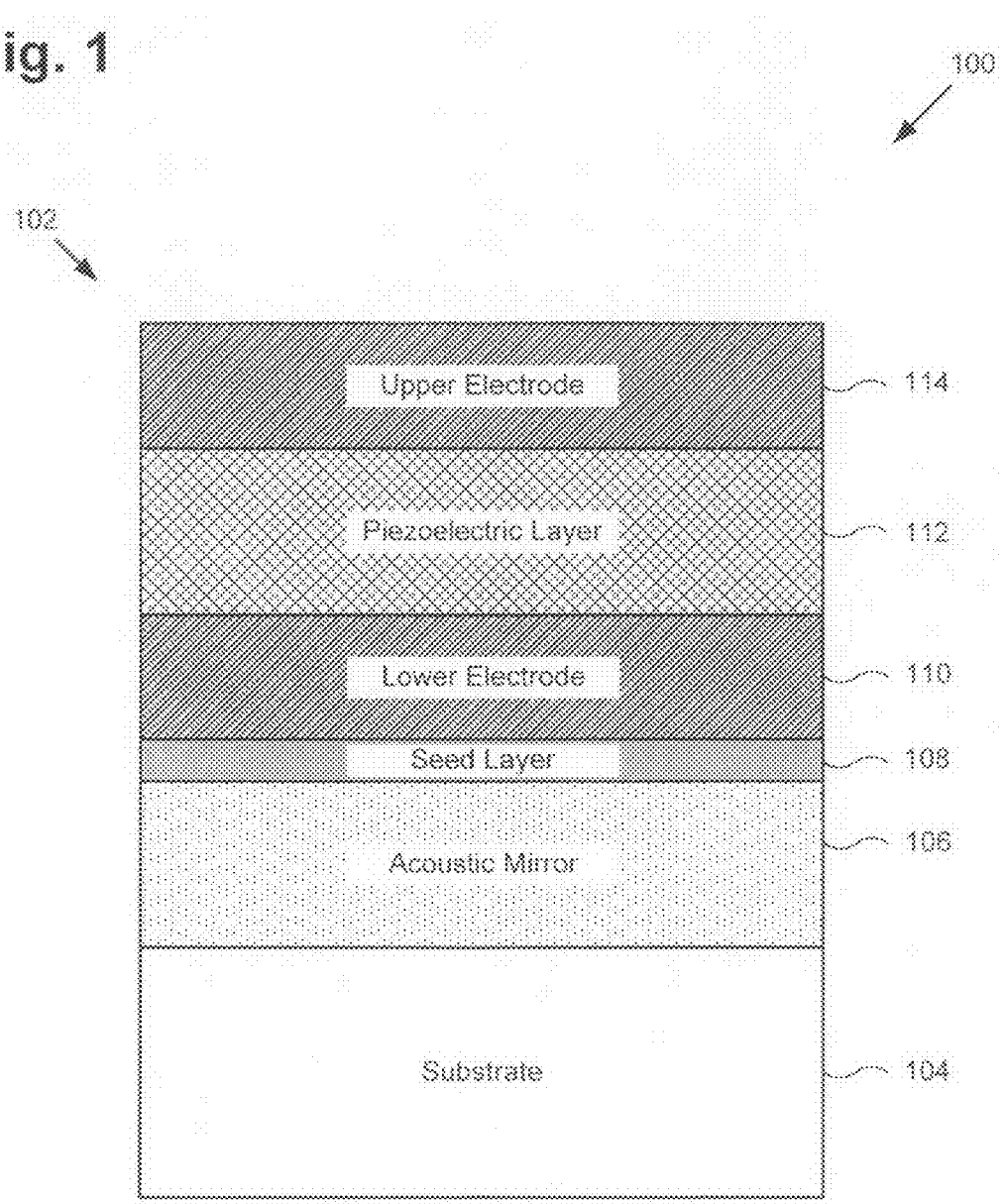
FIG. 1 illustrates a cross-sectional view of a conventional exemplary bulk acoustic wave resonator.

FIG. 1 shows a cross-sectional view of a semiconductor die including a conventional exemplary BAW resonator. In FIG. 1, structure 100 includes conventional BAW resonator 102 on substrate 104. Conventional BAW resonator 102 includes acoustic mirror 106, seed layer 108, lower electrode 110, piezoelectric layer 112, and upper electrode 114. Conventional BAW resonator 102 can be used in a BAW filter, such as a BAW radio frequency (RF) filter, or as a resonator in a frequency control circuit, for example.

As shown in FIG. 1, acoustic mirror 106 is situated over substrate 104, which can be a silicon substrate, and seed layer 108 is situated over acoustic mirror 106. Acoustic mirror 106 acoustically isolates conventional BAW resonator 102 from substrate 104 and can comprise a number of alternating dielectric and metal layers, where each dielectric layer, which can comprise, for example, silicon oxide, provides a low acoustic impedance layer and each metal layer, which can comprise a high density metal, such as tungsten (W), provides a high acoustic impedance layer. In acoustic mirror 106, for example, each dielectric layer can be formed by using a chemical vapor deposition (CVD) process and each metal layer can be formed by using a physical vapor deposition (PVD) process, which is also known as sputter deposition process.

Seed layer 108 can comprise a material that is selected so as to cause the grain of lower electrode 110 to orient properly, which is necessary for growing a high textured piezoelectric layer. Seed layer 108 can comprise, for example, tungsten nitride (WN) or other suitable material and can be formed by using a PVD process or other suitable deposition process. Prior to forming seed layer 108, extensive surface preparation, which can include CMP (chemical mechanical polishing) and/or reactive etch treatment, of underlying layers in acoustic mirror 106 is also typically required in conventional BAW resonator 102 to grow a high textured piezoelectric layer on lower electrode 110.

Also shown in FIG. 1, lower electrode 110 is situated on seed layer 108, piezoelectric layer 112 is situated on lower electrode 110, and upper electrode 114 is situated on piezoelectric layer 112. Lower electrode 110 and upper electrode 114 can each comprise molybdenum (Mo), tungsten, or other suitable high density metal and can be formed by using a PVD process or other suitable deposition process. Piezoelectric layer 112 can comprise aluminum nitride (AlN), zinc oxide (ZnO), or other suitable piezoelectric material and can be formed by using a PVD process or other suitable deposition process.

As a result of utilizing seed layer 108 and performing extensive surface preparation of underlying layers in mirror structure 106 prior to forming seed layer 108, conventional BAW resonator 102 can provide a properly oriented lower electrode (i.e. lower electrode 110). As a result, conventional BAW resonator 102 can achieve a highly textured (i.e. oriented) piezoelectric layer (i.e. piezoelectric layer 112). However, the extensive surface preparation required to achieve a highly textured piezoelectric layer in conventional BAW resonator 102 can undesirably increase processing complexity and manufacturing cost. Also, lower electrode 110 typically comprises a single layer of high density metal to achieve increased electromechanical coupling in conventional BAW resonator 102. However, as a result of the relatively high resistance of the high density metal, lower electrode 110 can increase electrical loss in conventional BAW resonator 102 and, thereby, undesirably reduce resonator performance.

Figure 2:
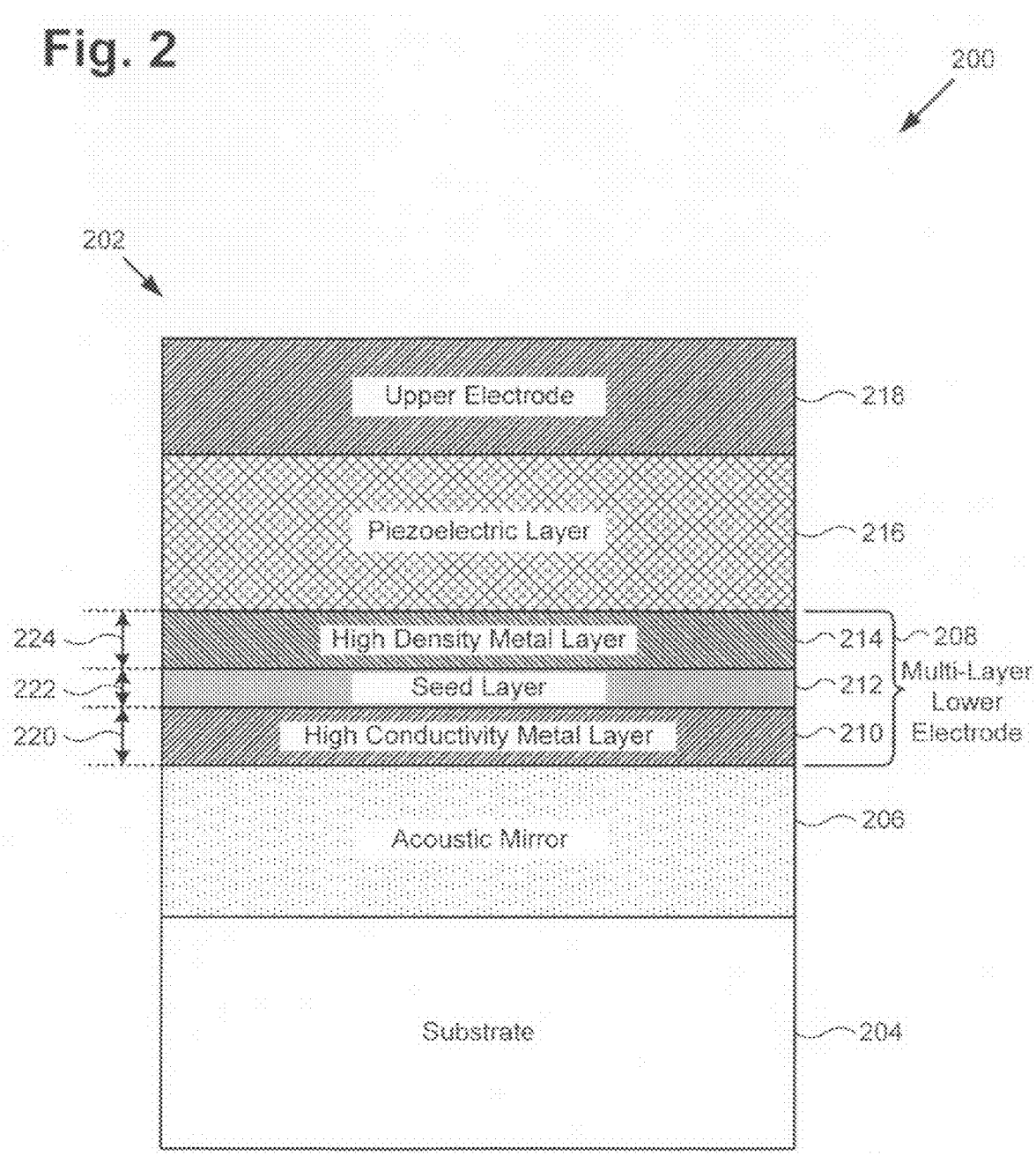
FIG. 2 illustrates a cross-sectional view of an exemplary bulk acoustic wave resonator including an exemplary multi-layer bottom electrode in accordance with one embodiment of the present invention.

FIG. 2 shows a cross-sectional view of a semiconductor die including an exemplary BAW resonator including a multi-layer lower electrode in accordance with one embodiment of the present invention. Certain details and features have been left out of FIG. 2, which are apparent to a person of ordinary skill in the art. In FIG. 2, structure 200 includes BAW resonator 202 on substrate 204. BAW resonator 202 includes acoustic mirror 206, multi-layer lower electrode 208, which includes high conductivity metal layer 210, seed layer 212, and high density metal layer 214, piezoelectric layer 216, and upper electrode 218. In one embodiment, BAW resonator 202 can be a film bulk acoustic resonator (FBAR), wherein a sacrificial layer can be utilized in place of acoustic mirror 206. In such embodiment, the sacrificial layer can be partially removed to form an air cavity for providing acoustic isolation from substrate 204. BAW resonator 202 can be used in a BAW filter, such as a BAW RF filter, or as a resonator in a frequency control circuit, for example.

As shown in FIG. 2, acoustic mirror 206 is situated over substrate 204, which can be a silicon substrate, and high conductivity metal layer 210 is situated over acoustic mirror 206. Acoustic mirror 206 acoustically isolates BAW resonator 202 from substrate 204 and can comprise a number of alternating dielectric and metal layers, where each dielectric layer, which can comprise, for example, silicon oxide, provides a low acoustic impedance layer and each metal layer, which can comprise a high density metal, such as tungsten (W), provides a high acoustic impedance layer. In acoustic mirror 206, for example, each dielectric layer can be formed by using a CVD process and each metal layer can be formed by using a PVD process.

High conductivity metal layer 210 can comprise, for example, aluminum, gold, copper, or other suitable high conductivity metal or metal alloy. In one embodiment, high conductivity metal layer 210 can comprise aluminum copper (AlCu), which can be approximately 1.0 percent copper to reduce undesirable electromigration. High conductivity metal layer 210 has thickness 220, which can be, for example, between 1000.0 Angstroms and 3000.0 Angstroms in one exemplary embodiment. High conductivity metal layer 210 can be formed, for example, by depositing a layer of aluminum or aluminum copper over acoustic mirror 206 by using a PVD process or other suitable deposition process.

Also shown in FIG. 2, seed layer 212 is situated on high conductivity metal layer 210 and high density metal layer 214 is situated on seed layer 212. Seed layer 212 can comprise a suitable material that is selected to cause high density metal layer 214 to have a grain structure that is properly oriented so as to enable a highly textured piezoelectric layer (i.e. piezoelectric layer 216) to be grown thereon. Seed layer 212 can comprise, for example, titanium tungsten nitride (TiWN), aluminum nitride (AlN), tungsten nitride (WN), or other suitable metallic compound material. Seed layer 212 has thickness 222, which can be between 50.0 Angstroms and 200.0 Angstroms in one embodiment.

Seed layer 212 can be formed, for example, by depositing a layer of tungsten nitride on high conductivity metal layer 210 by using a PVD process or other suitable deposition process. In one embodiment, seed layer 212 and high conductivity metal layer 210 can be formed in the same process chamber by using a PVD process, wherein seed layer 212 can comprise a compound comprising the same metal as in high conductivity metal layer 210. In one embodiment, seed layer 212 and high conductivity metal layer 210 can be formed in different process chambers, wherein seed layer 212 can comprise a compound that does not comprise the same metal as in high conductivity metal layer 210.

High density metal layer 214 can comprise molybdenum, tungsten, or other suitable high density metal and has thickness 224, which can be between 500.0 Angstroms and 2000.0 Angstroms in an exemplary embodiment. High density metal layer 214 can be formed by depositing a layer of a high density metal, such as molybdenum, on seed layer 212 by using a PVD process or other suitable deposition process. In one embodiment, high density metal layer 214 and seed layer 212 can be formed in the same process chamber, wherein seed layer 212 can comprise a compound comprising the same metal as in high density metal layer 214. In one embodiment, high density metal layer 214 and seed layer 212 can be formed in different process chambers, wherein seed layer 212 can comprise a compound that does not comprise the same metal as in high density metal layer 214. In one embodiment, high conductivity metal layer 210, seed layer 212, and high density metal layer 214 can each be formed in a different process chamber and can each include a different metal. Different methods of fabricating high conductivity metal, seed, and high density metal layers in the invention's multi-layer lower electrode are further discussed below in relation to FIGS. 4, 5, and 6.

Further shown in FIG. 2, piezoelectric layer 216 is situated on high density metal layer 214 and upper electrode 218 is situated on piezoelectric layer 216. Piezoelectric layer 216 can comprise aluminum nitride, zinc oxide, or other suitable piezoelectric material. Piezoelectric layer 216 can be formed, for example, by depositing a layer of aluminum nitride on high density metal layer 214 by using a PVD process or other suitable deposition process. Upper electrode 218 can comprise a single high density metal, such as molybdenum or tungsten, or a combination of suitable metals. Upper electrode 218 can be formed, for example, by using a PVD process or other suitable deposition process to deposit a layer of molybdenum or tungsten on piezoelectric layer 216.

As a result of forming a piezoelectric layer on a multi-layer lower electrode comprising a high conductivity metal layer, a seed layer, and a high density metal layer as discussed above, the invention achieves a highly textured (i.e. oriented) piezoelectric layer. Also, by forming a multi-layer lower electrode including a high conductivity metal layer, which has a significantly lower resistance than the high density metal layer, the invention advantageously achieves a BAW resonator having reduced electrical loss compared to conventional BAW resonator 102, which includes a lower electrode comprising only a high density metal. By reducing electrical loss, the invention achieves a BAW resonator having increased performance compared to a conventional BAW resonator 102. Additionally, by forming a multi-layer electrode including a high conductivity metal layer, a seed layer, and a high density metal layer, the invention can provide a highly textured piezoelectric layer while requiring a reduced amount of underlying surface preparation, thereby advantageously reducing process complexity and manufacturing cost.

Figure 3:
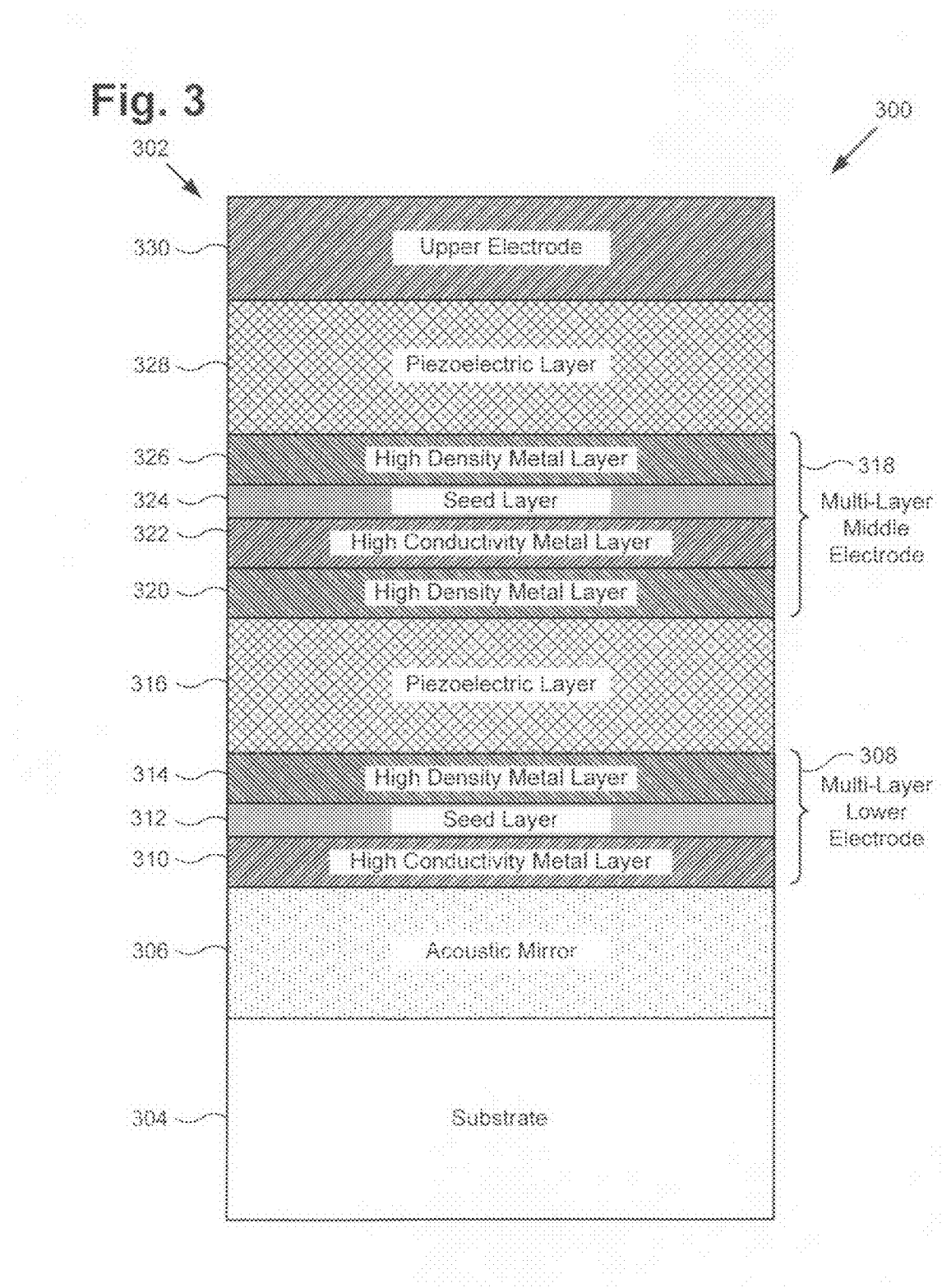
FIG. 3 illustrates a cross-sectional view of an exemplary bulk acoustic wave stacked resonator including exemplary multi-layer lower and middle electrodes in accordance with one embodiment of the present invention.

FIG. 3 shows a cross-sectional view of a semiconductor die including an exemplary BAW stacked resonator having multi-layer lower and middle electrodes in accordance with one embodiment of the present invention. Certain details and features have been left out of FIG. 3, which are apparent to a person of ordinary skill in the art. In FIG. 3, substrate 304, acoustic mirror 306, multi-layer lower electrode 308, high conductivity metal layer 310, seed layer 312, high density metal layer 314, and piezoelectric layer 316 correspond, respectively, to substrate 204, acoustic mirror 206, multi-layer lower electrode 208, high conductivity metal layer 210, seed layer 212, high density metal layer 214, and piezoelectric layer 216 in structure 200 in FIG. 2.

Structure 300 includes BAW stacked resonator 302 on substrate 304. BAW stacked resonator 302, which can be used in, for example, a BAW filter, such as a BAW RF filter, or as a resonator in a frequency control circuit, includes acoustic mirror 306, multi-layer lower electrode 308, which includes high conductivity metal layer 310, seed layer 312, and high density metal layer 314, piezoelectric layer 316, multi-layer middle electrode 318, which includes high density metal layer 320, high conductivity metal layer 322, seed layer 324, and high density metal layer 326, piezoelectric layer 328, and upper electrode 320.

As shown in FIG. 3, acoustic mirror 306 is situated over substrate 304, high conductivity metal layer 310 is situated over acoustic mirror 306, seed layer 312 is situated over high conductivity metal layer 310, high density metal layer 314 is situated over seed layer 312, and piezoelectric layer 316 is situated over high density metal layer 314. High conductivity metal layer 310, seed layer 312, high density metal layer 314, and piezoelectric layer 316 are substantially similar in composition, thickness, and formation to respective high conductivity metal layer 210, seed layer 212, high density metal layer 214, and piezoelectric layer 216 in BAW resonator 202 in FIG. 2. In one embodiment, a sacrificial layer can be utilized in place of acoustic mirror 306, wherein the sacrificial layer can be partially removed to form an air cavity for providing acoustic isolation from substrate 304.

Also shown in FIG. 3, high density metal layer 320 is situated over piezoelectric layer 316, high conductivity metal layer 322 is situated over high density metal layer 320, seed layer 324 is situated over high conductivity metal layer 322, high density metal layer 326 is situated over seed layer 324, piezoelectric layer 328 is situated over high density metal layer 326, and upper electrode 330 is situated over piezoelectric layer 328. High density metal layer 320 can comprise molybdenum, tungsten, or other suitable high density metal and can be formed, for example, by using a PVD or other suitable deposition process to deposit a layer of molybdenum or tungsten on piezoelectric layer 316. High conductivity metal layer 322, seed layer 324, high density metal layer 326, and piezoelectric layer 328 are substantially similar in composition, thickness, and formation to respective high conductivity metal layer 310, seed layer 312, high density metal layer 314, and piezoelectric layer 316. Upper electrode 330 is substantially similar in composition, thickness, and formation to upper electrode 218 in BAW resonator 202.

BAW stacked resonator 302 includes two multi-layer electrodes (i.e. multi-layer lower electrode 308 and multi-layer middle electrode 318) and two piezoelectric layers (i.e. piezoelectric layers 316 and 328), which are arranged in a stacked configuration. In contrast to multi-layer lower electrode 308, multi-layer middle electrode 318 includes an additional high density metal layer (i.e. high density metal layer 320), which is required to interface with piezoelectric layer 316 to achieve increased electromechanical coupling. By utilizing a multi-layer lower electrode and a multi-layer middle electrode that include a seed layer situated between a high conductivity metal layer and a high density metal layer, BAW stacked resonator 302 provides highly textured piezoelectric layers 316 and 328. BAW stacked resonator 302 provides similar advantages as BAW resonator 202 in FIG. 2 as discussed above.

It is manifest to those skilled in the art that a generalization of the stacked resonator is the coupled resonator where high conductivity metal layer 322 is replaced by a multitude of layers to control the acoustic coupling between the top piezo layer and the bottom piezo layer to provide desired filtering characteristics. Other generalized structures may have more than two stacked piezoelectric layers. Even in such cases where additional layers are added for device functionality, the present invention can be applied to form optimized multilayered electrodes just beneath subsequent piezoelectric layers.

Figure 4:
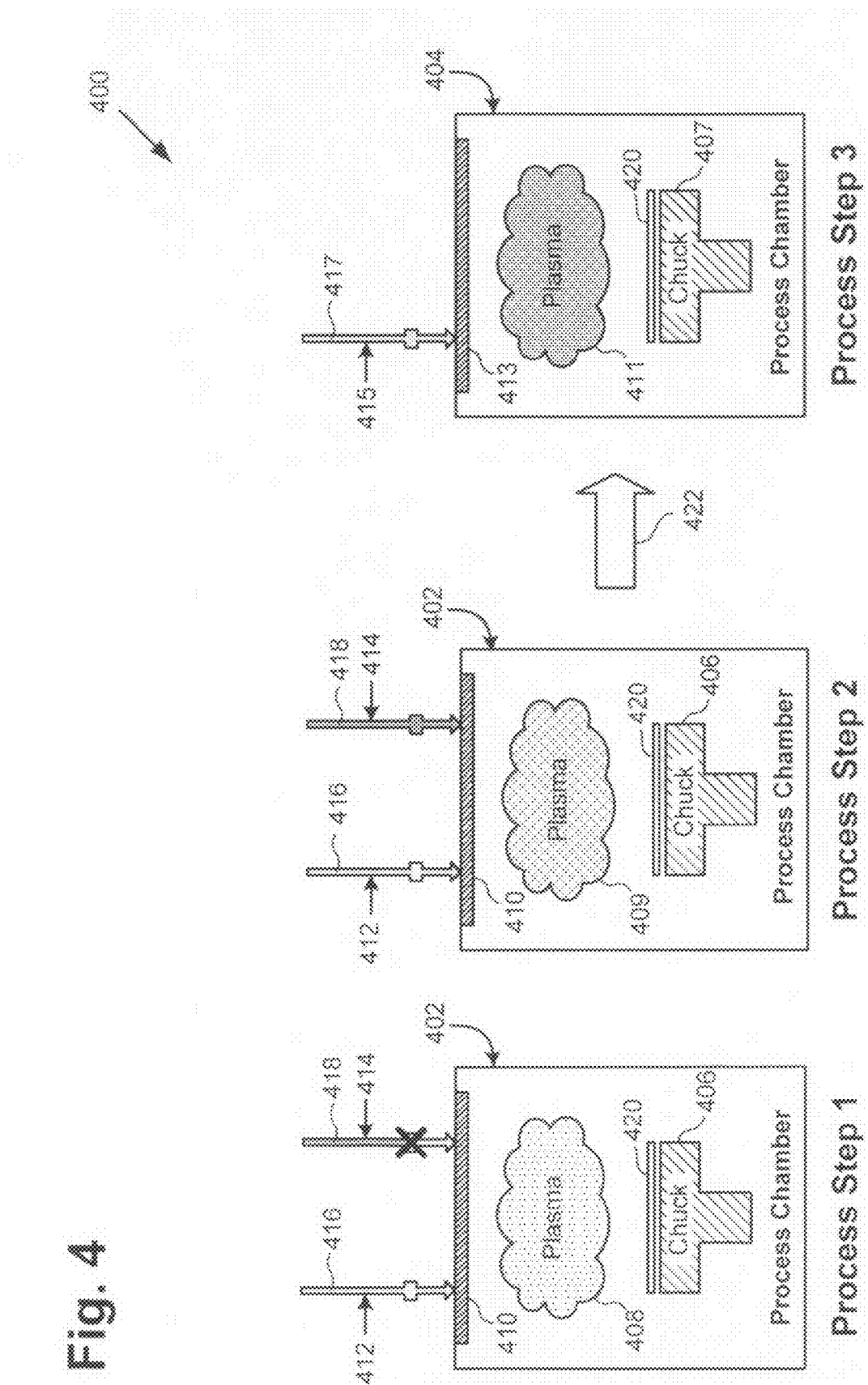
FIG. 4 is a diagram of a wafer processing system including two process chambers used for forming an exemplary multi-layer electrode in accordance with one embodiment of the present invention.

FIG. 4 shows a diagram of a wafer processing system used for forming an exemplary multi-layer electrode in accordance with one embodiment of the present invention. Certain details and features have been left out of FIG. 4, which are apparent to a person of ordinary skill in the art. Wafer processing system 400 includes process chamber 402, which includes chuck 406, plasma 408 (for process step 1), plasma 409 (for process step 2), metal target 410, and gas input lines 412 and 414, and process chamber 404, which includes chuck 407, plasma 411, metal target 413, and gas input line 415.

Although wafer 420 is shown in process chambers 402 and in process chamber 404 in FIG. 4, wafer 420 will reside in process chamber 402 for deposition of a high conductivity metal layer at process step 1 and for deposition of a seed layer at process step 2 and will be transferred to process chamber 404 (as indicated by arrow 422) for deposition of a high density metal layer on the seed layer at process step 3. Process chambers 402 and 404 can be, for example, PVD process chambers and are utilized for forming of an embodiment of invention's multi-layer electrode, such as multi-layer bottom electrode 208 in BAW resonator 202.

As shown in FIG. 4, in process chamber 402, wafer 420 is mounted on chuck 406, which can be, for example, an electrostatic chuck, plasma 408 is formed between wafer 420 and metal target 410, which can be electrically negative with respect to chuck 406 and the walls of chamber 402, in process step 1, and plasma 409 is formed between wafer 420 and metal target 410 in process step 2. Wafer 420 can include a silicon substrate, such as substrate 204 in FIG. 2, and an overlying acoustic mirror, such as acoustic mirror 206.

In the embodiment in FIG. 4, plasma 408 can comprise argon ions and plasma 409 can comprise argon and nitrogen ions. In another embodiment, plasma 408 and plasma 409 can comprise a different combination of ions. In the embodiment in FIG. 4, metal target 410 can comprise aluminum or aluminum copper. In another embodiment, metal target 410 can comprise a metal other than aluminum or a suitable metal alloy other than aluminum copper. Also shown in FIG. 4, gas input lines 412 and 414 are connected to process chamber 402 and can supply respective gases 416 and 418. In the embodiment in FIG. 4, gases 416 and 418 can be argon and nitrogen, respectively.

Further shown in FIG. 4, in process chamber 404, wafer 420 is mounted on chuck 407, which can be, for example, an electrostatic chuck, and plasma 411 is formed between wafer 420 and metal target 413, which can be electrically negative with respect to chuck 407 and the walls of chamber 404. Plasma 411 can comprise, for example, argon ions in one embodiment. In the embodiment in FIG. 4, metal target 413 can comprise tungsten. In another embodiment, metal target 413 can comprise a metal other than tungsten. Also shown in FIG. 4, gas input line 415 is connected to process chamber 404 and can supply gas 417, which can be, for example, argon.

At process step 1, process chamber 402 is utilized to deposit a high conductivity metal layer, such as high conductivity metal layer 210, comprising aluminum over a dielectric layer in an acoustic mirror, such as acoustic mirror 206, on wafer 420. In one embodiment, the high conductivity metal layer can be deposited over a sacrificial layer situated on wafer 420. The layer of aluminum can be deposited on wafer 420 by utilizing positively charged argon ions in plasma 408 to dislodge aluminum atoms in the aluminum target (i.e. metal target 410) in a scattering process. The dislodged aluminum atoms can form a layer of aluminum over the dielectric layer in acoustic mirror 206 on wafer 420. The layer of aluminum can have a thickness of, for example, between 1000.0 Angstroms and 3000.0 Angstroms in one embodiment.

At process step 2, process chamber 402 is utilized to deposit a seed layer, such as seed layer 212, comprising aluminum nitride on the high conductivity metal layer, such as high conductivity metal layer 210, deposited on wafer 420 at process step 1. The layer of aluminum nitride (i.e. the seed layer) can be deposited on wafer 420 by utilizing nitrogen and argon ions, which have a positive charge, in plasma 409 to dislodge aluminum atoms in the aluminum target (i.e. metal target 410) in a scattering process. The dislodged aluminum atoms can combine with the nitrogen ions in plasma 409 to form a layer of aluminum nitride on the surface of wafer 420. The nitrogen gas can be applied to process chamber 402 for a period of time of between 2.0 seconds and 30.0 seconds, in one embodiment, to form the aluminum nitride seed layer, which can have a thickness of, for example, between 50.0 Angstroms and 200.0 Angstroms in one exemplary embodiment. After the seed layer comprising aluminum nitride has been deposited on wafer 420 in process chamber 402, wafer 420 is transferred, as indicated by arrow 422, to process chamber 404 for process step 3.

At process step 3, process chamber 404 is utilized to deposit a high density metal layer, such as high density metal layer 214, comprising tungsten on the seed layer, such as seed layer 212, on wafer 420. The layer of tungsten can be deposited on wafer 420 by utilizing positively charged argon ions in plasma 411 to dislodge tungsten atoms in the tungsten target (i.e. metal target 413) in a scattering process. The dislodged tungsten atoms can form a layer of tungsten on the seed layer previously deposited on wafer 420 at process step 2. The layer of tungsten can have a thickness of, for example, between 500.0 Angstroms and 2000.0 Angstroms in one embodiment.

Thus, in the embodiment of the invention shown in FIG. 4, a multi-layer electrode, such as multi-layer lower electrode 208 in FIG. 2, is formed by sequentially depositing a high conductivity metal layer and a seed layer in a first process chamber and depositing a high density metal layer on the seed layer in a second process chamber. In the embodiment in FIG. 4, the invention advantageously provides a multi-layer electrode, such as multi-layer lower electrode 208, on which a highly textured (i.e. oriented) piezoelectric layer, such as piezoelectric layer 216, can be grown. The multi-layer electrode formed in embodiment of the invention in FIG. 4 also provides similar advantages as multi-layer lower electrode 208 in BAW resonator 202 as discussed above.

It may seem surprising to illustrate the use of an insulating seed layer between multiple metallic layers in the electrode. It is true that this metal-insulator-metal stack is not conductive and forms a capacitor. However, if the insulating layer is sufficiently thin, the capacitance of the metal-insulator-metal stack can be sufficiently large so as to provide a low RF impedance. Thus this structure can function quite well as a low impedance electrode for RF filtering applications.

Figure 5:
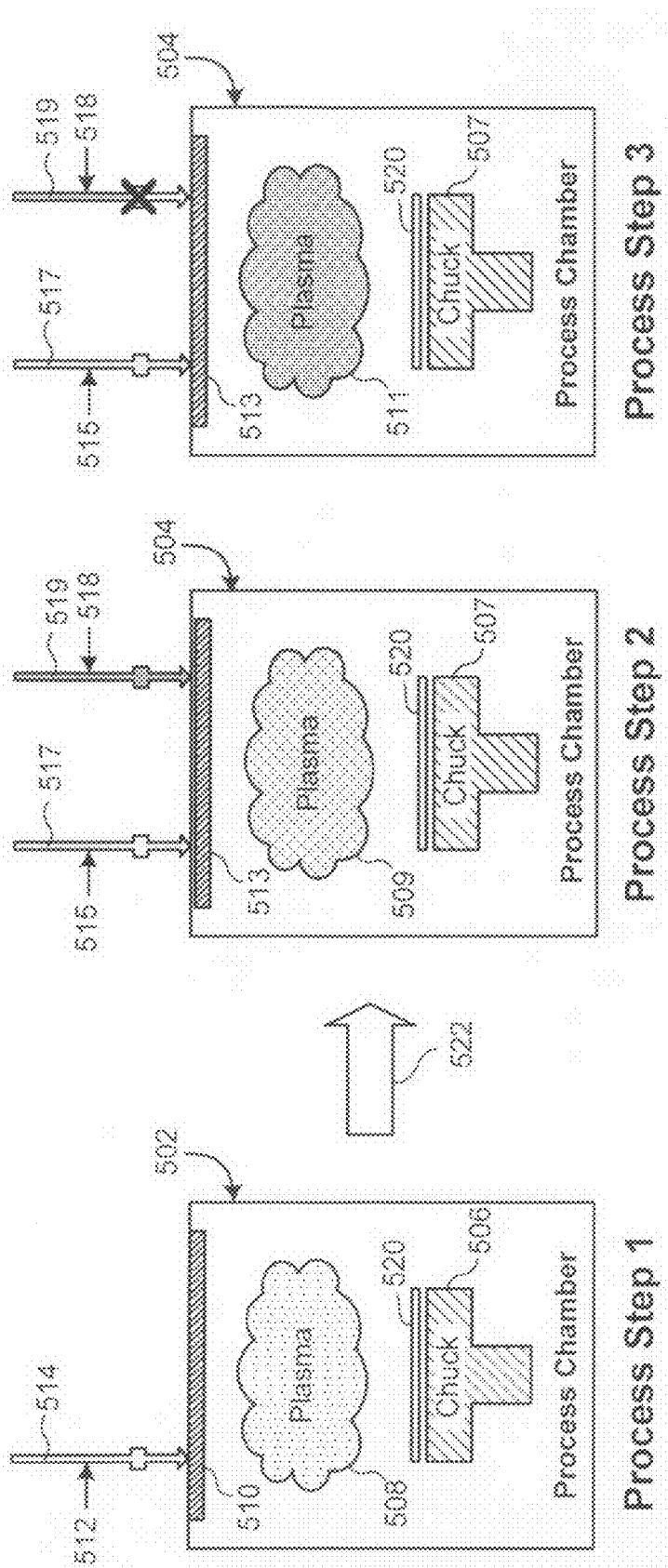
FIG. 5 is a diagram of a wafer processing system including two process chambers used for forming an exemplary multi-layer electrode in accordance with one embodiment of the present invention.

FIG. 5 shows a diagram of a wafer processing system used for forming an exemplary multi-layer electrode in accordance with one embodiment of the present invention. Certain details and features have been left out of FIG. 5, which are apparent to a person of ordinary skill in the art. Wafer processing system 500 includes process chamber 502, which includes chuck 506, plasma 508 (for process step 1), metal target 510, and gas input line 512, and process chamber 504, which includes chuck 507, plasma 509 (provided at process step 2), plasma 511 (provided at process step 3), metal target 513, and gas input lines 515 and 518.

Although wafer 520 is shown in process chamber 502 and in process chamber 504 in FIG. 5, wafer 520 will reside in process chamber 502 for deposition of a high conductivity metal layer at process step 1 and will be transferred to process chamber 504 (as indicated by arrow 522) for deposition of a seed layer at process step 2 and for deposition of a high density metal layer on the seed layer at process step 3. Process chambers 502 and 504 can be, for example, PVD process chambers and are utilized for forming of an embodiment of invention's multi-layer electrode, such as multi-layer bottom electrode 208 in BAW resonator 202.

As shown in FIG. 5, in process chamber 502, wafer 520 is mounted on chuck 506, which can be, for example, an electrostatic chuck, and plasma 508 is formed between wafer 520 and metal target 510, which can be electrically negative with respect to chuck 506 and the walls of chamber 502. Plasma 508 can comprise, for example, argon ions in one embodiment. In the embodiment in FIG. 5, metal target 510 can comprise aluminum or aluminum copper. In another embodiment, metal target 510 can comprise a metal other than aluminum or a suitable metal alloy other than aluminum copper. Also shown in FIG. 5, gas input line 512 is connected to process chamber 502 and can supply gas 514, which can be, for example, argon.

Also shown in FIG. 5, in process chamber 504, wafer 520 is mounted on chuck 507, which can be, for example, an electrostatic chuck, plasma 509 is formed between wafer 520 and metal target 513, which can be electrically negative with respect to chuck 507 and the walls of chamber 504, in process step 2, and plasma 511 is formed between wafer 520 and metal target 513 in process step 3. Wafer 520 can include a silicon substrate, such as substrate 204 in FIG. 2, and an overlying acoustic mirror, such as acoustic mirror 206. In the embodiment in FIG. 5, plasma 509 can comprise argon and nitrogen ions and plasma 511 can comprise argon ions. In another embodiment, plasma 509 and plasma 511 can comprise a different combination of ions. In the embodiment in FIG. 5, metal target 513 can comprise tungsten. In another embodiment, metal target 513 can comprise a metal other than tungsten. Also shown in FIG. 5, gas input lines 515 and 518 are connected to process chamber 504 and can supply respective gases 517 and 519. In the embodiment in FIG. 5, gases 517 and 519 can be argon and nitrogen, respectively.

At process step 1, process chamber 502 is utilized to deposit a high conductivity metal layer, such as high conductivity metal layer 210, comprising aluminum over a dielectric layer in an acoustic mirror, such as acoustic mirror 206, on wafer 520. In one embodiment, the high conductivity metal layer can be deposited over a sacrificial layer situated on wafer 520. The layer of aluminum can be deposited on wafer 520 by utilizing positively charged argon ions in plasma 508 to dislodge aluminum atoms in the aluminum target (i.e. metal target 510) in a scattering process. The dislodged aluminum atoms can form a layer of aluminum on the surface of wafer 520. The layer of aluminum can have a thickness of, for example, between 1000.0 Angstroms and 3000.0 Angstroms in one embodiment. After the high conductivity metal layer comprising aluminum has been deposited on wafer 520 in process chamber 502, wafer 520 is transferred, as indicated by arrow 522, to process chamber 504 for process steps 2 and 3.

At process step 2, process chamber 504 is utilized to deposit a seed layer, such as seed layer 212, comprising tungsten nitride on the high conductivity metal layer deposited on wafer 520 in process chamber 502 at process step 1. The layer of tungsten nitride can be deposited on wafer 520 by utilizing nitrogen and argon ions, which have a positive charge, in plasma 509 to dislodge tungsten atoms in the tungsten target (i.e. metal target 513) in a scattering process. The dislodged tungsten atoms can combine with the nitrogen ions in plasma 509 to form a layer of tungsten nitride on the surface of wafer 420. Nitrogen gas can be applied to process chamber 504 for a period of time of between 2.0 seconds and 30.0 seconds, in one embodiment, to form the tungsten nitride seed layer, which can have a thickness of, for example, between 50.0 Angstroms and 200.0 Angstroms in one exemplary embodiment.

At process step 3, immediately after the seed layer has been formed, gas 519, which can comprise nitrogen, in gas input line 518 is cut off in process chamber 504. After the nitrogen ions remaining in process chamber 504 have been depleted, the resulting plasma (i.e. plasma 511) in process chamber 504 includes argon ions without a significant amount of nitrogen ions. As a result, the argon ions will strike the tungsten target (i.e. metal target 513) and dislodge tungsten molecules, which are deposited on wafer 520 to form a substantially pure layer of tungsten on the previously deposited tungsten nitride seed layer. The layer of tungsten can have a thickness of, for example, between 500.0 Angstroms and 2000.0 Angstroms in one exemplary embodiment.

Thus, in the embodiment of the invention shown in FIG. 5, a multi-layer electrode, such as multi-layer lower electrode 208 in FIG. 2 is formed by depositing a high conductivity metal layer in a first process chamber and sequentially depositing a seed layer and a high density metal layer on the high conductivity metal layer in a second process chamber. The multi-layer electrode formed in the embodiment in FIG. 5 provides similar advantages as the multi-layer electrode formed in the embodiment of the invention in FIG. 4 discussed above.

Figure 6:
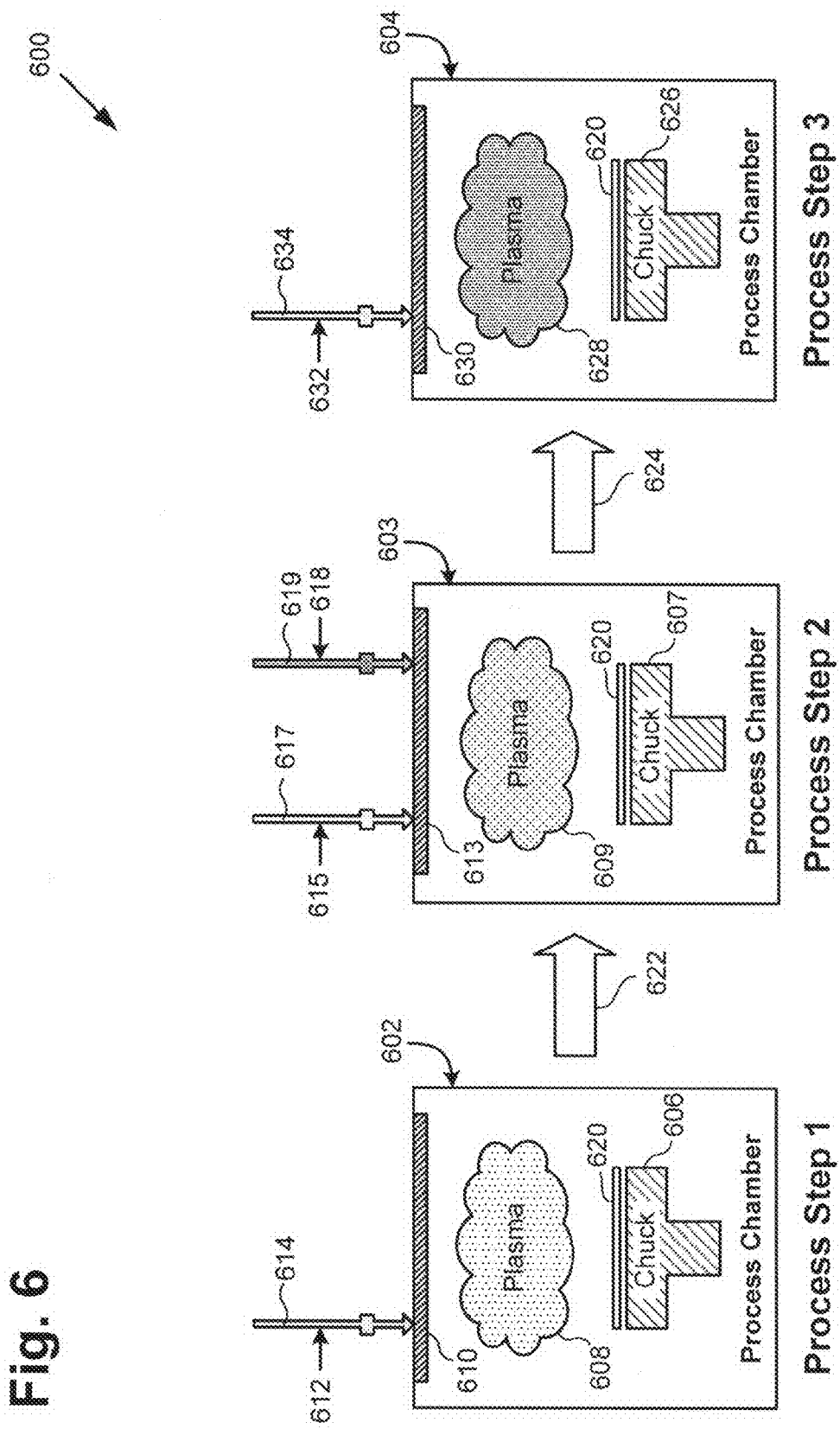
FIG. 6 is a diagram of a wafer processing system including three process chambers used for forming an exemplary multi-layer electrode in accordance with one embodiment of the present invention.

FIG. 6 shows a diagram of a wafer processing system used for forming an exemplary multi-layer electrode in accordance with one embodiment of the present invention. Certain details and features have been left out of FIG. 6, which are apparent to a person of ordinary skill in the art. Wafer processing system 600 includes process chamber 602, which includes chuck 606, plasma 608 (provided at process step 1), metal target 610, and gas input line 612, process chamber 603, which includes chuck 607, plasma 609 (provided at process step 2), metal target 613, and gas input lines 615 and 618, and process chamber 604, which includes chuck 626, plasma 628 (provided at process step 3), metal target 630, and gas input line 632.

Although wafer 620 is shown in process chambers 602, 603, and 604 in FIG. 6, wafer 620 will reside in process chamber 602 for deposition of a high conductivity metal layer at process step 1, will be transferred to process chamber 603 (as indicated by arrow 622) for deposition of a seed layer at process step 2, and will be transferred to process chamber 604 (as indicated by arrow 624) for deposition of a high density metal layer at process step 3. Process chambers 602, 603, and 604 can be, for example, PVD process chambers and are utilized for forming an embodiment of invention's multi-layer electrode, such as multi-layer bottom electrode 208 in BAW resonator 202.

As shown in FIG. 6, in process chamber 602, wafer 620 is mounted on chuck 606, which can be, for example, an electrostatic chuck, and plasma 608 is formed between wafer 620 and metal target 610, which can be electrically negative with respect to chuck 606 and the walls of chamber 602. Wafer 620 can include a silicon substrate, such as substrate 204 in FIG. 2, and an overlying acoustic mirror, such as acoustic mirror 206. Plasma 608 can comprise, for example, argon ions in one embodiment. In the embodiment in FIG. 6, metal target 610 can comprise aluminum or aluminum copper. In another embodiment, metal target 610 can comprise a metal other than aluminum or a suitable metal alloy other than aluminum copper. Also shown in FIG. 6, gas input line 612 is connected to process chamber 602 and can supply gas 614, which can be, for example, argon.

Also shown in FIG. 6, in process chamber 603, wafer 620 is mounted on chuck 607, which can be, for example, an electrostatic chuck, plasma 609 is formed between wafer 620 and metal target 613, which can be electrically negative with respect to chuck 607 and the walls of chamber 603, in process step 2. In the embodiment in FIG. 6, plasma 609 can comprise argon and nitrogen ions. In another embodiment, plasma 609 and can comprise a different combination of ions. In the embodiment in FIG. 6, metal target 613 can comprise tungsten. In another embodiment, metal target 613 can comprise a metal other than tungsten. Also shown in FIG. 6, gas input lines 615 and 618 are connected to process chamber 603 and can supply respective gases 617 and 619. In the embodiment in FIG. 6, gases 617 and 619 can be argon and nitrogen, respectively.

Further shown in FIG. 6, in process chamber 604, wafer 620 is mounted on chuck 626, which can be, for example, an electrostatic chuck, plasma 628 is formed between wafer 620 and metal target 630, which can be electrically negative with respect to chuck 626 and the walls of chamber 604, in process step 3. In the embodiment in FIG. 6, plasma 628 can comprise argon ions. In another embodiment, plasma 628 can comprise different ions. In the embodiment in FIG. 6, metal target 630 can comprise molybdenum. In another embodiment, metal target 630 can comprise a metal other than molybdenum. Also shown in FIG. 6, gas input line 632 is connected to process chamber 604 and can supply gas 634, which can be argon in the embodiment in FIG. 6.

At process step 1, process chamber 602 is utilized to deposit a high conductivity metal layer, such as high conductivity metal layer 210, comprising aluminum over a dielectric layer in an acoustic mirror, such as acoustic mirror 206, on wafer 620. In one embodiment, the high conductivity metal layer can be deposited over a sacrificial layer situated on wafer 620. The layer of aluminum can be deposited on wafer 620 by utilizing positively charged argon ions in plasma 608 to dislodge aluminum atoms in the aluminum target (i.e. metal target 610) in a scattering process. The dislodged aluminum atoms can form a layer of aluminum on the surface of wafer 620. The layer of aluminum can have a thickness of, for example, between 1000.0 Angstroms and 3000.0 Angstroms in one embodiment. After the high conductivity metal layer comprising aluminum has been deposited on wafer 620 in process chamber 602, wafer 620 is transferred, as indicated by arrow 622, to process chamber 603 for process step 2.

At process step 2, process chamber 603 is utilized to deposit a seed layer, such as seed layer 212, comprising tungsten nitride on the high conductivity metal layer deposited on wafer 620 in process chamber 602 at process step 1. The layer of tungsten nitride (i.e. the seed layer) can be deposited on wafer 620 by utilizing nitrogen and argon ions, which have a positive charge, in plasma 609 to dislodge tungsten atoms in the tungsten target (i.e. metal target 613) in a scattering process. The dislodged tungsten atoms can combine with the nitrogen ions in plasma 609 to form a layer of tungsten nitride on the surface of wafer 620. Nitrogen gas can be applied to process chamber 603 for a period of time of between 2.0 seconds and 30.0 seconds, in one embodiment, to form the tungsten nitride seed layer, which can have a thickness of, for example, between 50.0 Angstroms and 200.0 Angstroms in one exemplary embodiment. After the seed layer comprising tungsten nitride has been deposited on wafer 620 in process chamber 603, wafer 620 is transferred, as indicated by arrow 624, to process chamber 604 for process step 3.

At process step 3, process chamber 604 is utilized to deposit a high density metal layer, such as high density metal layer 214, comprising molybdenum on the tungsten nitride seed layer previously deposited on wafer 620 at process step 2. The layer of molybdenum can be deposited on wafer 620 by utilizing positively charged argon ions in plasma 628 to dislodge molybdenum atoms in the molybdenum target (i.e. metal target 630) in a scattering process. The dislodged molybdenum atoms can form a layer of molybdenum on the seed layer on wafer 620. The layer of molybdenum can have a thickness of between 500.0 Angstroms and 2000.0 Angstroms in one embodiment.

Thus, in the embodiment of the invention shown in FIG. 6, a multi-layer electrode, such as multi-layer lower electrode 208 in FIG. 2, is formed by depositing a high conductivity metal layer in a first process chamber, depositing a seed layer on the high conductivity metal layer in a second process chamber, and depositing a high density metal layer on the seed layer in a third process chamber. The multi-layer electrode formed in the embodiment in FIG. 6 provides similar advantages as the multi-layer electrode formed in the embodiment of the invention in FIG. 4 discussed above.

Thus, as discussed above, by forming a multi-layer lower electrode comprising a high conductivity metal layer, a seed layer, and a high density metal layer, the invention provides a BAW resonator having a highly textured piezoelectric layer that can be achieved at reduced process complexity and manufacturing cost compared to a highly textured piezoelectric layer in a conventional BAW resonator. Also, by utilizing a high conductivity metal layer in the multi-layer lower electrode, the invention advantageously achieves a BAW resonator having reduced electrical loss and, consequently, increased resonator performance compared to a conventional BAW resonator that utilizes a lower electrode comprising a single high density metal layer. The invention's multilayer lower electrode can also be repeatedly applied in piezoelectric devices containing more than one piezoelectric layer in their construction.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A bulk acoustic wave (BAW) resonator, comprising:
a high conductivity metal layer situated over a substrate;
a seed layer situated over said high conductivity metal layer;
a high density metal layer situated over said seed layer;
a piezoelectric layer situated over said high density metal layer, said high density metal layer causing said piezoelectric layer to have an oriented grain structure;
wherein said high conductivity metal layer, said seed layer, and said high density metal layer form a multi-layer lower electrode of said BAW resonator, and
wherein said seed layer comprises a compound comprising a same metal as in said high density metal layer.

2. The BAW resonator of claim 1 further comprising an acoustic mirror underlying said high conductivity metal layer.

3. A bulk acoustic wave (BAW) resonator, comprising:
a high conductivity metal layer situated over a substrate;
a seed layer situated over said high conductivity metal layer;
a high density metal layer situated over said seed layer;

a piezoelectric layer situated over said high density metal layer, said high density metal layer causing said piezoelectric layer to have an oriented grain structure;

wherein said high conductivity metal layer, said seed layer, and said high density metal layer form a multi-layer lower electrode of said BAW resonator, and wherein said seed layer comprises a compound comprising a same metal as in said high conductivity metal layer.

4. The BAW resonator of claim 1, wherein the high conductivity metal layer comprises at least one of aluminum, gold and copper.

5. The BAW resonator of claim 4, wherein the high density metal layer comprises one of molybdenum and tungsten.

6. The BAW resonator of claim 5, wherein the seed layer comprises one of titanium tungsten nitride and tungsten nitride.

7. A resonator device, comprising:

an acoustic mirror formed on a substrate;

a multilayer first electrode formed on the acoustic mirror, the first electrode comprising a high conductivity metal layer formed on the acoustic mirror, a seed layer formed on the high conductivity metal layer, and a high density metal layer formed on the seed layer;

a piezoelectric layer formed on the first electrode; and a second electrode formed on the piezoelectric layer, wherein the high conductivity metal layer of the first electrode is formed of a different material than the high density metal layer of the first electrode, and wherein the seed layer comprises a compound including a same metal as in one of the high conductivity metal layer or the high density metal layer.

8. The device of claim 7, wherein the acoustic mirror comprises alternating low acoustic impedance layers and high acoustic impedance layers, acoustically isolating the the first electrode, the piezoelectric layer and the second electrode from the substrate.

9. The device of claim 8, wherein the high conductivity metal layer comprises at least one of aluminum, gold and copper.

10. The device of claim 9, wherein the high density metal layer comprises one of molybdenum and tungsten.

11. The device of claim 10, wherein the seed layer comprises one of titanium tungsten nitride, aluminum nitride and tungsten nitride.

12. The device of claim 10, wherein each of the low acoustic impedance layers of the acoustic mirror comprises one of silicon oxide and each of the high acoustic impedance layers of the acoustic mirror comprises tungsten.

13. The BAW resonator of claim 3 further comprising an acoustic mirror underlying said high conductivity metal layer.

14. The BAW resonator of claim 3, wherein the high conductivity metal layer comprises at least one of aluminum, gold and copper.

15. The BAW resonator of claim 14, wherein the high density metal layer comprises one of molybdenum and tungsten.

16. The BAW resonator of claim 15, wherein the seed layer comprises aluminum nitride.

* * * * *